(12) United States Patent
Blalock et al.

(10) Patent No.: US 6,516,742 B1
(45) Date of Patent: Feb. 11, 2003

(54) APPARATUS FOR IMPROVED LOW PRESSURE INDUCTIVELY COUPLED HIGH DENSITY PLASMA REACTOR

(75) Inventors: Guy T. Blalock; Kevin G. Donohoe, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/031,400

(22) Filed: Feb. 26, 1998

(51) Int. Cl.⁷ .......................... C23C 16/00; H03H 7/38
(52) U.S. Cl. .............. 118/723 I; 315/111.21; 333/17.3; 333/32
(58) Field of Search .................. 118/723 I, 723 IR; 204/298.31, 298.34; 315/111.21; 156/345; 216/58, 61, 63, 67, 68, 70; 333/17.3, 32

(56) References Cited

U.S. PATENT DOCUMENTS

| | | | |
|---|---|---|---|
| 4,918,031 A | | 4/1990 | Flamm et al. |
| 5,110,438 A | * | 5/1992 | Ohmi et al. ........... 204/298.34 |
| 5,126,028 A | | 6/1992 | Hurwitt, et al. ........ 204/192.13 |
| 5,140,223 A | * | 8/1992 | Gesche et al. ......... 204/298.34 |
| 5,234,529 A | | 8/1993 | Johnson |
| 5,280,154 A | * | 1/1994 | Cuomo et al. ......... 204/298.31 |
| 5,314,603 A | | 5/1994 | Sugiyama et al. ..... 204/298.32 |
| 5,336,385 A | | 8/1994 | Shimose et al. ....... 204/298.03 |
| 5,401,350 A | * | 3/1995 | Patrick et al. ............ 118/723 I |
| 5,417,826 A | | 5/1995 | Blalock |
| 5,523,261 A | | 6/1996 | Sandhu |
| 5,529,657 A | * | 6/1996 | Ishii ........................ 118/723 I |
| 5,540,800 A | * | 7/1996 | Qian ....................... 118/723 I |
| 5,599,396 A | | 2/1997 | Sandhu |
| 5,629,653 A | * | 5/1997 | Stimson ..................... 333/17.3 |
| 5,650,032 A | * | 7/1997 | Keller et al. ............. 118/723 I |
| 5,664,066 A | | 9/1997 | Sun et al. ..................... 395/23 |
| 5,685,941 A | | 11/1997 | Forster, et al. .............. 156/345 |
| 5,759,280 A | * | 6/1998 | Holland et al. ........... 118/723 I |
| 5,800,619 A | * | 9/1998 | Holland et al. ........... 118/723 I |
| 5,888,414 A | * | 3/1999 | Collins et al. ................. 216/68 |
| 6,030,667 A | | 2/2000 | Nakagawa et al. ......... 427/569 |

FOREIGN PATENT DOCUMENTS

| | | |
|---|---|---|
| EP | 0607797 A1 | 7/1994 |
| EP | 0810816 A1 | 12/1997 |
| EP | 845800 A1 | 3/1998 |
| JP | 08-88097 | 4/1996 |

OTHER PUBLICATIONS

Lieberman, M.A., et al., *Principles of Plasma Discharges and Materials Processing*, New York: John Wiley & Sons, Inc., 389, 406, No Date Available.

\* cited by examiner

*Primary Examiner*—Jill Warden
(74) *Attorney, Agent, or Firm*—Schwegman, Lundberg, Woessner & Kluth, P.A.

(57) ABSTRACT

A plasma reactor comprises an electromagnetic energy source coupled to a radiator through first and second variable impedance networks. The plasma reactor includes a chamber having a dielectric window that is proximate to the radiator. A shield is positioned between the radiator and the dielectric window. The shield substantially covers a surface of the radiator near the dielectric window. A portion of the radiator that is not covered by the shield is proximate to a conductive wall of the chamber. Plasma reactor operation includes the following steps. A plasma is ignited in a chamber with substantially capacitive electric energy coupled from the radiator. A variable impedance network is tuned so that the capacitive electric energy coupled into the chamber is diminished. The plasma is then powered with substantially magnetic energy.

24 Claims, 4 Drawing Sheets

APPARATUS FOR IMPROVED LOW PRESSURE INDUCTIVELY COUPLED HIGH DENSITY PLASMA REACTOR

FIELD OF THE INVENTION

The present invention relates generally to integrated circuit fabrication, and more specifically to integrated circuit fabrication with plasma reactors.

BACKGROUND OF THE INVENTION

Plasma reactors are commonly used for semiconductor processing. As disclosed in U.S. Pat. No. 4,918,031 to Flamm et al. (hereinafter "the Flamm Patent"), herein incorporated by reference, plasma reactors are used for material formation and removal on wafers. Material formation is accomplished by plasma enhanced chemical vapor deposition (PECVD). With PECVD, a plasma and precursor gases are combined in a reactor to form a material on a wafer. The precursor gases may be, for example, silane and ammonia. The plasma provides the energy to breakdown the constituent elements, such as silicon and nitrogen, of the precursor gases. Constituent elements that have high affinity for one another combine to form the desired material, for example silicon nitride, on the wafer.

Alternatively, plasma reactors are used to remove material from the wafer by etching. The plasma reactor can be used during different processing steps to remove different materials, including oxides, aluminum, polysilicon and silicides, from a wafer.

If used for etching a wafer, the plasma reactor will contain a reactive gas, such as a fluorocarbon or chlorine at a low pressure. The type of gas used in the plasma reactor depends on the corresponding material to be removed from the wafer. It is preferable to etch specific materials on the wafer with plasmas of certain gases because the plasmas selectively etch the specific materials at relatively high rates.

Construction of a plasma reactor will now be described. The plasma, gases, and wafer are contained in a chamber of the reactor. The chamber is substantially formed by metal, such as aluminum, that is electrically grounded. Portions of the chamber interior may be covered with an insulating liner, made from quartz or alumina for example. The chamber has at least one open surface that is sealed by a dielectric window. The dielectric window may be formed from quartz, alumina, silicon nitride or aluminum nitride.

Outside the chamber, a radiator, such as a coil, is placed proximate to the dielectric window. The coil may be planar or cylindrical. For example, the TCP series of plasma reactors 120 made by Lam Research, Inc. (Fremont, Calif.) uses a planar coil 122, as illustrated in FIG. 1A. However, the HDP series of plasma reactors 130 manufactured by Applied Materials, Inc. (Santa Clara, Calif.) uses a cylindrical coil 132, as shown in FIG. 1B. Different coil designs are also described in the Flamm Patent and U.S. Pat. No. 5,234,529 to Johnson (hereinafter "the Johnson Patent") which is herein incorporated by reference. One terminal of each coil is coupled to an electromagnetic energy source. The electromagnetic energy source is typically operated at radio frequencies. The coil and dielectric window permit the transmission of electric and magnetic energy from the electromagnetic energy source into the chamber. The energy is used to ignite, or strike, and then power the plasma created from a gas. Typically, the coil is designed to make electrons in the plasma travel in a toroidal pattern which has a radius about equal to the radius of the wafer. The coil is also designed to excite the plasma so that it will uniformly affect, such as etch, the wafer.

It is desirable to increase the amount of energy transferred from the electromagnetic energy source to the plasma. Hence, a variable-impedance-matching network is inserted between the electromagnetic energy source and the coil in order to achieve repeatable, controlled delivery of energy to the plasma. The variable-impedance-matching network is adjusted during plasma reactor operation to enhance the energy transfer between the electromagnetic energy source and the plasma.

To operate the reactor, the plasma must be first ignited and then powered. The plasma is created from a gas by igniting the gas with energy radiated from the coil. Specifically, the plasma is ignited by accelerating free electrons in the chamber into molecules of the gas. As a result, the gas molecules are ionized. If a sufficient number of molecules are ionized, an avalanche effect is created and the plasma is ignited.

Free electrons can be accelerated with electric and magnetic fields. However, practically, only capacitive electric energy can be used to ignite the plasma. The force exerted on a free electron by the capacitive electric energy in the chamber prior to ignition is much larger than the force exerted by the magnetic energy. The force from the magnetic energy is relatively small because its strength is proportional to the velocity of the free electrons, which is also small before the plasma is ignited.

Thus, the plasma is preferably ignited by an electric field between the coil and a conducting wall of the chamber. However, once the plasma is ignited, the capacitive electric energy can have a detrimental effect on the reactor. The capacitive electric energy causes insulating material from the insulating liner to be sputtered onto the dielectric window. As a result, the insulating liner is depleted during the course of plasma operation. The insulating material sputtered onto the window may fall off and contaminate the wafer. Also, because the voltage is not uniform across the coil, the amplitude of the capacitive electric energy in the chamber and incident on the wafer is also not uniform. Because some process parameters are dependent upon the amplitude of the capacitive electric energy incident across the wafer, undesirable variations of process parameters on the wafer may occur during wafer processing in the plasma reactor. As a result, the structure and electrical performance of the integrated circuits formed on the wafer may vary. Hence, the manufacturing yield and cost of integrated circuits may respectively decrease and increase. Therefore, after ignition, the plasma should be powered by magnetic energy, and the amplitude of capacitive electric energy incident upon the wafer should be uniform, or approximately zero.

The Johnson Patent suggests suppressing the capacitive electric energy in the chamber with a non-magnetic conductor, known as a shield, which is placed between the coil and the chamber. The shield may be fully or partially coextensive with the surface of the coil. The shield has slots, and is electrically grounded or floating. The slots suppress eddy currents that circulate in the shield and cause undesired energy dissipation. Examples of shield designs are found in the Johnson Patent.

The Johnson Patent discloses that the capacitive electric energy from the coil is useful for striking the plasma. Therefore, the Johnson Patent describes a system with a mechanical shutter to vary the dimensions of the slots in the shield. The mechanical shutter is opened when the plasma is ignited. Because the slot dimensions are increased when the shutter is opened, the capacitive electric energy coupled from the coil into the chamber increases. After the plasma is ignited, the shutters are closed to reduce the amount of capacitive electric energy supplied to the chamber.

The mechanical shutter disclosed in the Johnson Patent must be operated by a motor and a control system. This technique is relatively complex, and may be prone to reliability and repeatability problems. Therefore, there is a need for a plasma reactor design that uses a less complex design.

SUMMARY OF THE INVENTION

The present invention solves the above-mentioned problems in the art and other problems which will be understood by those skilled in the art upon reading and understanding the present specification. The present invention is a plasma reactor that comprises an electromagnetic energy source coupled to a radiator through first and second variable impedance networks. The plasma reactor includes a chamber having a dielectric window that is proximate to the radiator. A shield is positioned between the radiator and the dielectric window. The shield substantially covers a surface of the radiator near the dielectric window. A portion of the radiator that is not covered by the shield is proximate to a conductive wall of the chamber.

In one embodiment, the second variable impedance network is a variable capacitor. In another embodiment, the radiator is a coil, such as a planar coil.

Plasma reactor operation will now be described. A plasma is ignited in a chamber with substantially capacitive electric energy coupled from the radiator. A variable impedance network is tuned so that the capacitive electric energy coupled into the chamber is diminished after ignition. The plasma is then powered with substantially magnetic energy. As a result, the lifetime of the plasma reactor is extended. Also, the cleaning and down time of the plasma reactor is reduced.

In one embodiment, the chamber pressure is set to be less than approximately eighty millitorr prior to the ignition step. The chamber pressure is then set to be less than approximately thirty millitorr after the ignition step. A second variable impedance network is tuned upon varying the chamber pressure.

It is a benefit of the present invention that it requires a less powerful and costly electromagnetic energy source. It is also an advantage of the present invention that it may be used in plasma reactors for both material deposition and removal. Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements.

DETAILED DESCRIPTION OF THE EMBODIMENTS

Figure 1A:
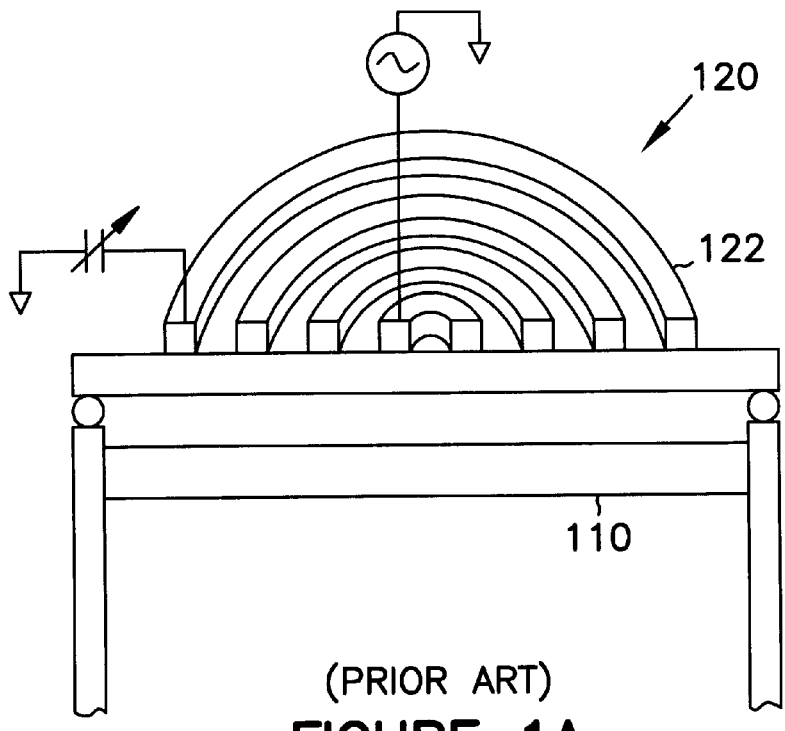
FIG. 1A illustrates a cross-sectional diagram of a prior art Lam TCP plasma reactor.
Figure 1B:
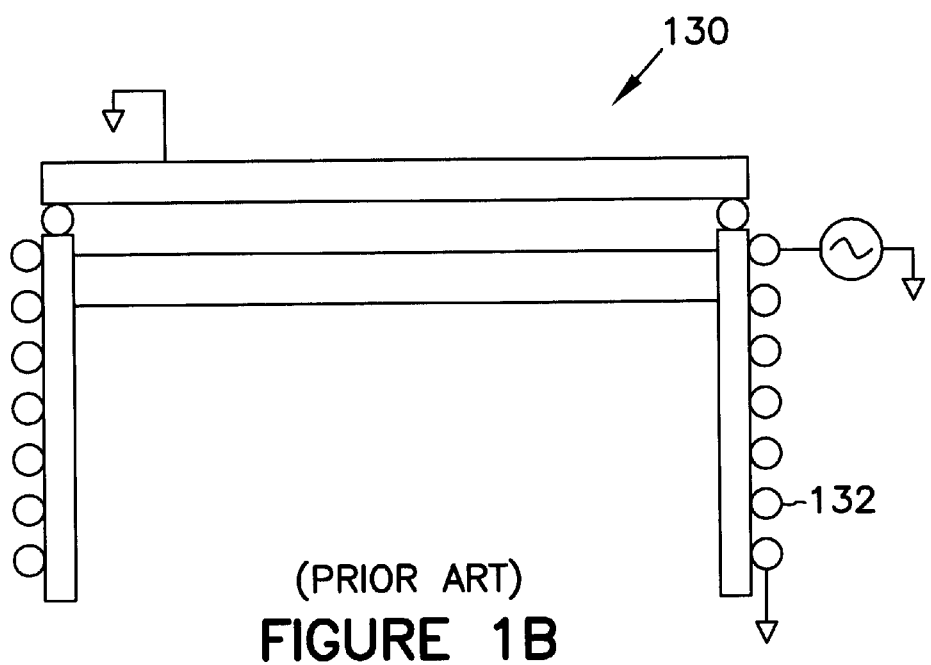
FIG. 1B illustrates a cross-sectional diagram of a prior art Applied Materials HDP plasma reactor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the claims, along with the full scope of equivalents to which such claims are entitled.

Figure 2A:
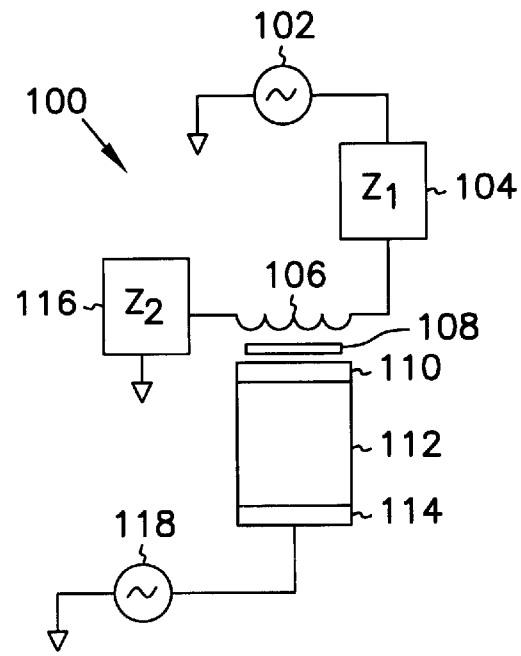
FIG. 2A illustrates a schematic diagram of a plasma reactor.
Figure 2B:
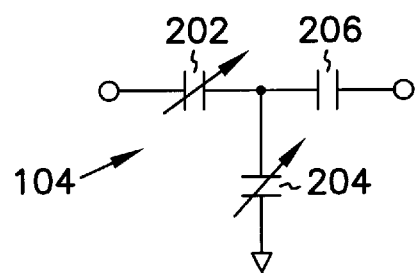
FIG. 2B illustrates a schematic diagram of a first variable impedance network.
Figure 2C:
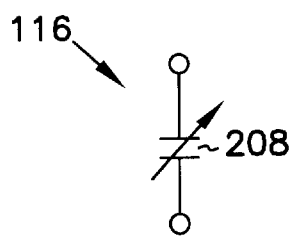
FIG. 2C illustrates a schematic diagram of a second variable impedance network.

FIG. 2A illustrates a schematic diagram of one embodiment of the present invention, an inductively coupled plasma reactor 100. The plasma reactor 100 includes a first electromagnetic energy source 102 coupled to an electromagnetic radiator 106 through first and second variable-impedance-matching networks 104, 116. The electromagnetic energy source 102 emits radio frequencies of less than one hundred megahertz. However, other embodiments of the invention are envisioned that operate at higher frequencies. The radiator 106 may be a planar 122 or cylindrical 132 coil. The first variable-impedance-matching network 104 includes a series variable capacitor 202 coupled to a shunt variable capacitor 204 and a series fixed capacitor 206, as shown in FIG. 2B. The second variable-impedance-matching network 116 comprises a variable capacitor 208, as shown in FIG. 2C. However, other electrical network topologies may be used for the first and second variable-impedance-matching networks 104, 116.

Figure 2D:
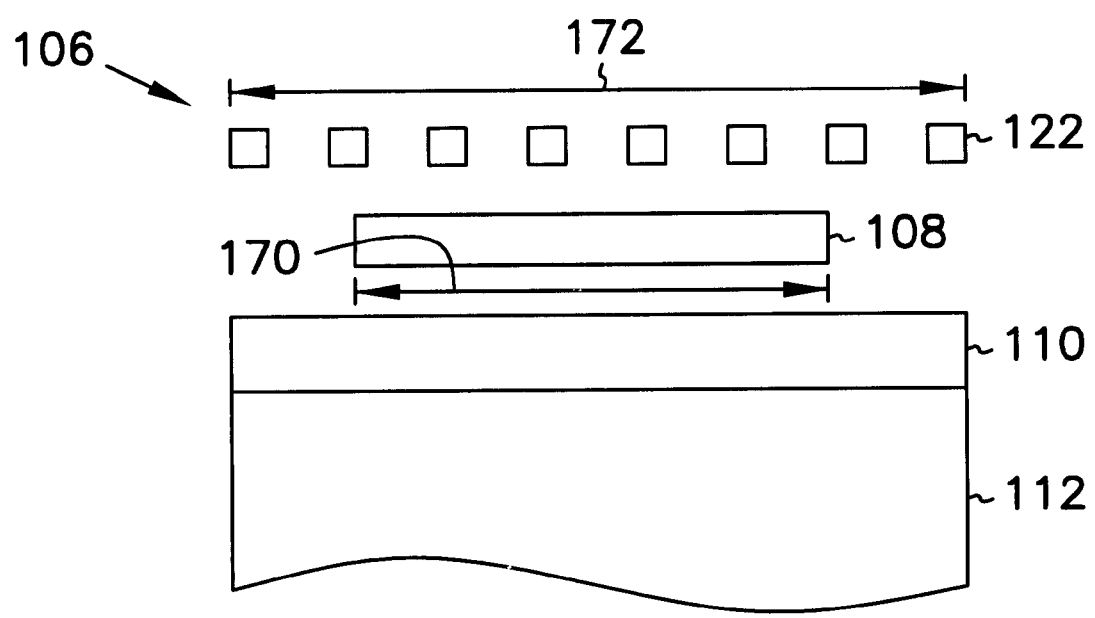
FIG. 2D illustrates a cross-sectional diagram of a plasma reactor.

The radiator 106 is positioned proximate to the dielectric window 110 of the plasma reactor 100. A shield 108, such as a Faraday shield, is inserted between the radiator 106 and the dielectric window 110. The shield 108 is designed so that it substantially covers the surface of the radiator 106 that is near to the dielectric window 110, as illustrated in FIG. 2D.

In one embodiment, the shield 108 is circular and has a diameter 170 at least one half, but less than, the diameter 172 of a radiator 106 that is a planar coil 122. As a result, only a relatively small portion of the radiator 106 will be exposed through the dielectric window 110 to a conductive wall of the chamber 112. The exposed portion of the radiator 106 is relatively close to the conductive wall of the chamber 112. Therefore, relatively little capacitive electric energy is required to create an electric field necessary to ignite the plasma. Thus, a less powerful and less costly electromagnetic energy source 102 can be used in the plasma reactor 100.

A second electromagnetic energy source 118 may optionally be coupled to the wafer 114 in the chamber 112. The second electromagnetic energy source 118 is used particularly in plasma etchers to control the direction, and thus enhance the anisotropic nature, of the etch.

Figure 3A:
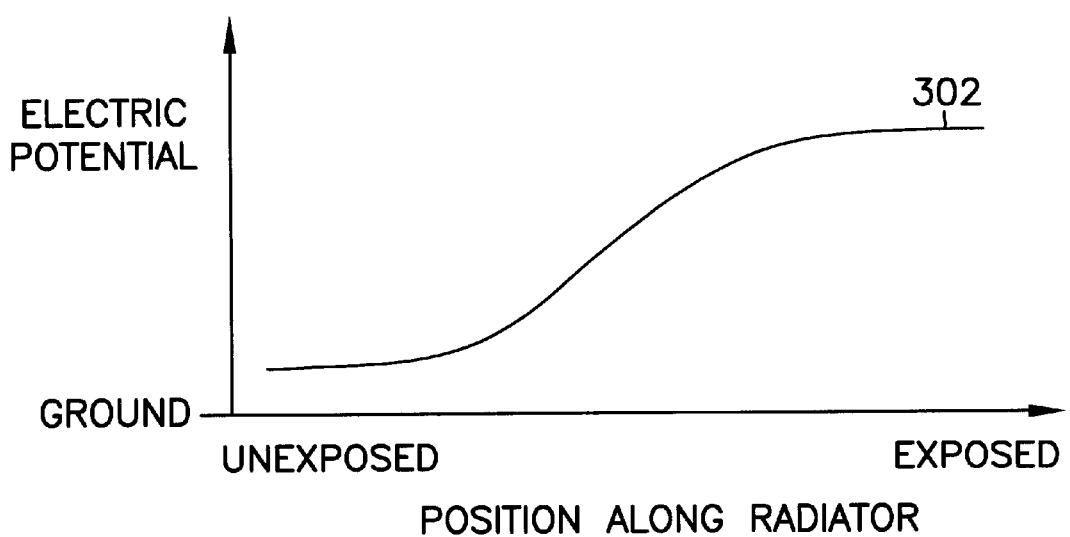
FIG. 3A illustrates a plot of electric potential versus radiator position when a relatively high electric potential exists between the exposed portion of the radiator and the nearby conducting wall.

The operation of the present invention will now be described. Initially, a wafer 114, such as a semiconductor substrate, is placed into the chamber 112. Then, the electromagnetic energy source 102 is turned on. Next, the first variable-impedance-matching network 104 is tuned to enhance the energy transfer between the electromagnetic energy source 102 and the radiator 106. Also, the second variable-impedance-matching network 116 is tuned to vary the voltage-standing-wave on the radiator 106 so that a relatively high electric potential 302 exists between the exposed portion of the radiator 106 and the nearby conductive wall of the chamber 112, as shown in FIG. 3A. In this case, for example, the variable capacitor 208 would be tuned to a relatively low capacitance value. The pressure of the gas in the chamber 112 is reduced to less than approximately 80 millitorr. Below this pressure, enough particles are present in the plasma reactor to permit an avalanche effect to be created by electrons accelerated by the capacitive electric energy. Thus, the capacitive electric energy coupled into the chamber 112 by the radiator 106 ignites the plasma. Plasma ignition is complete when the plasma is substantially powered by magnetic energy. For example, when the plasma ignition is complete, the plasma density is greater than $10^{10}$ $cm^{-3}$.

Figure 3B:
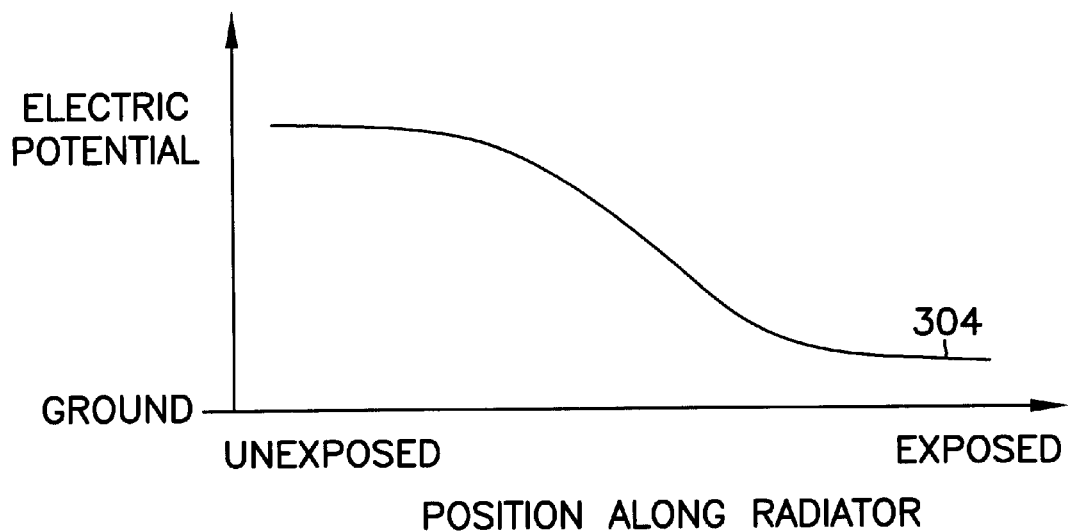
FIG. 3B illustrates a plot of electric potential versus radiator position when a relatively low electric potential exists between the exposed portion of the radiator and the nearby conducting wall.

After plasma ignition, the pressure in the chamber 112 is reduced to less than approximately 30 millitorr, or whatever is desired for subsequent processing. Because the chamber pressure changes, the first variable impedance network 104 may be retuned to enhance the energy transfer between the electromagnetic energy source 102 and the plasma. When the plasma is nearly fully powered, the plasma remains substantially powered by magnetic energy and may have a density greater than $10^{11}$ $cm^{-3}$. The second variable-impedance-matching network 116 is also tuned, suddenly or slowly, to vary the voltage-standing-wave on the radiator 106 so that the region of relatively high electric potential of the radiator 106 is repositioned to a portion of the radiator 106 that is electrically isolated from the chamber 112, or unexposed, by the shield 108, as shown in FIG. 3B. After ignition, the second variable-impedance-matching network 116 may be tuned immediately or after a delay. Thus, a relatively low electric potential 304 exists between the exposed portion of the radiator and the nearby conducting wall. As a result, the deterioration of the chamber 112 and semiconductor process is diminished. In this case, for example, the variable capacitor 208 would be tuned to a relatively high capacitance value.

Conclusion

Although specific embodiments have been illustrated and described herein, it will be appreciated by those of ordinary skill in the art that any arrangement which is calculated to achieve the same purpose may be substituted for the specific embodiments shown. This patent is intended to cover any adaptations or variations of the present invention. Therefore, it is manifestly intended that this invention be limited only by the claims and the equivalents thereof.

We claim:

1. A plasma reactor, comprising:
   an electromagnetic energy source;
   a radiator operatively coupled to the electromagnetic energy source by first and second variable impedance networks, wherein the radiator, the electromagnetic energy source, the first variable impedance network and the second variable impedance network are coupled in series;
   a chamber having a window that is proximate to the radiator; and
   a shield, positioned between the radiator and the window, substantially covering a surface of the radiator near the window;
   wherein a portion of the radiator that is not covered by the shield is proximate to a conductive wall of the chamber; and
   wherein the first variable impedance network includes a first variable capacitor and a fixed capacitor serially connected between the electromagnetic energy source and the radiator, and further includes a shunt variable capacitor having a first plate connected between the electrical connection between the first variable capacitor and the fixed capacitor, and having a second plate connected to ground.

2. The plasma reactor of claim 1, wherein the electromagnetic energy source operates at a frequency of less than one hundred megahertz.

3. The plasma reactor of claim 1, wherein the chamber comprises a dielectric liner.

4. The plasma reactor of claim 1, wherein the second variable impedance network is a variable capacitor.

5. The plasma reactor of claim 1, wherein the chamber comprises a chamber adapted to hold a plasma that causes constituents of precursor gases in the chamber to form a material on a substrate in the chamber.

6. The plasma reactor of claim 1, further comprising a plasma that removes material from a substrate placeable in the chamber.

7. The plasma reactor of claim 1, further comprising a second electromagnetic energy source coupled to a wafer in the chamber.

8. The plasma reactor of claim 1, wherein the radiator is a coil.

9. The plasma reactor of claim 8, wherein the coil is a planar coil.

10. The plasma reactor of claim 1, wherein the shield comprises a Faraday shield.

11. The plasma reactor of claim 1, wherein the window comprises a dielectric window.

12. A plasma reactor, comprising:
   a radio frequency energy source;
   a radiator, operatively coupled to the radio frequency energy source by a variable impedance network and a first variable capacitor;
   a chamber having a dielectric window that is proximate to the radiator;
   a shield, positioned between the radiator and the dielectric window, substantially covering a surface of the radiator near the dielectric window;

wherein a portion of the radiator that is not covered by the shield is proximate to a conductive wall of the chamber; and wherein the variable impedance network includes,
a second variable capacitor serially connected to the radio frequency energy source,
a third variable capacitor connected in parallel across the second variable capacitor and the radio frequency energy source, and
a capacitor serially connected between the second variable capacitor and the radiator.

13. The plasma reactor of claim 12, wherein the radio frequency energy source operates at a frequency of less than one hundred megahertz.

14. The plasma reactor of claim 12, wherein the chamber comprises a dielectric liner.

15. The plasma reactor of claim 12, wherein the chamber comprises a chamber adapted to hold a plasma that causes constituents of precursor gases in the chamber to form a material on a substrate in the chamber.

16. The plasma reactor of claim 12, further comprising a plasma that removes material from a substrate placeable in the chamber.

17. The plasma reactor of claim 12, further comprising an electromagnetic energy source coupled to a substrate in the chamber.

18. The plasma reactor of claim 12, wherein the radiator is a coil.

19. The plasma reactor of claim 18, wherein the coil is a planar coil.

20. A plasma reactor, comprising:
a chamber having a dielectric window;
a radio frequency energy source;
a radiator positioned outside the chamber next to the dielectric window; and
a variable impedance network coupled between the radio frequency energy source and a first end of the radiator, and including:
a variable capacitor and a fixed capacitor serially connected between the radio frequency energy source and the radiator, and
a shunt variable capacitor having a first plate connected to the electrical connection between the variable capacitor and the fixed capacitor, and having a second plate connected to ground.

21. The plasma reactor of claim 20 further including a second variable impedance network connected between a second end of the radiator and ground.

22. The plasma reactor of claim 21 wherein the second variable impedance network includes a second variable capacitor connected between the second end of the radiator and ground.

23. A plasma reactor, comprising:
a chamber having a dielectric window;
a radio frequency energy source;
a radiator coil positioned outside the chamber next to the dielectric window;
a Faraday shield positioned between the dielectric window and the radiator coil; and
a first variable impedance network electrically coupled between the radio frequency energy source and a first location on the radiator coil, and having
a first variable capacitor and a fixed capacitor serially connected between the radio frequency energy source and the first location on the radiator, and
a shunt variable capacitor having a first plate connected to the electrical connection between the first variable capacitor and the fixed capacitor, and having a second plate connected to ground; and
a second variable impedance network electrically coupled to a second location on the radiator coil, and having a second variable capacitor connected between the second location on the radiator coil and ground.

24. A plasma reactor, comprising:
a plasma chamber having a dielectric window;
a radiator outside the plasma chamber next to the dielectric window;
an electromagnetic energy source providing RF energy to the radiator;
a tunable first variable capacitor and a fixed capacitor serially connected between the electromagnetic source and a first end of the radiator;
a tunable shunt variable capacitor having a first plate connected to the electrical connection between the first variable capacitor and the fixed capacitor, and having a second plate connected to ground; and
a tunable second series variable capacitor connected between a second end of the radiator and ground.

* * * * *

UNITED STATES PATENT AND TRADEMARK OFFICE
CERTIFICATE OF CORRECTION

PATENT NO. : 6,516,742 B1 Page 1 of 1
DATED : February 11, 2003
INVENTOR(S) : Guy T. Blalock and Kevin G. Donohoe It is certified that error appears in the above-identified patent and that said Letters Patent is hereby corrected as shown below:

Title page,
Item [56], U.S. PATENT DOCUMENTS, insert the following under "6,030,667 A":
-- 6,068,784    05/30/2000    Collins, K.S., et al.    216/68
    6,093,457    07/25/2000    Okumura, T., et al.    427/569
    6,109,206    08/29/2000    Maydan, D., et al.    118/723 IR
    6,207,027    03/27/2001    Ngan, K.K.    204/192.13 --
"5,540,800 A", delete "7/1996" and insert -- 6/1996 -- therefor.
"5,650,032 A", delete "7/1997" and insert -- 6/1997 -- therefor.

Column 6,
Line 12, delete "," after "networks" and insert -- ; -- therefor.
Line 12, delete "the radiator," after "wherein".
Line 13, delete "," after "source" and insert -- is coupled to -- therefor.
Line 13, insert -- , -- after "network".
Line 14, delete "and" before "the second" and insert -- which is serially connected to the radiator, wherein the radiator is serially connected to -- therefor.
Lines 14-15, delete "are coupled in series" after "network".
Line 17, delete "and" after "radiator;".

Column 8,
Line 20, insert -- coil -- after "radiator".

Signed and Sealed this

Second Day of September, 2003

JAMES E. ROGAN
*Director of the United States Patent and Trademark Office*